(12) United States Patent
Ware et al.

(10) Patent No.: US 12,222,829 B2
(45) Date of Patent: *Feb. 11, 2025

(54) MEMORY MODULE WITH DEDICATED REPAIR DEVICES

(71) Applicant: Rambus Inc., San Jose, CA (US)

(72) Inventors: Frederick A. Ware, Los Altos Hills, CA (US); Brent S. Haukness, Sunnyvale, CA (US); John Eric Linstadt, Palo Alto, CA (US); Scott C. Best, Palo Alto, CA (US)

(73) Assignee: Rambus Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/373,219

(22) Filed: Sep. 26, 2023

(65) Prior Publication Data
US 2024/0095134 A1 Mar. 21, 2024

Related U.S. Application Data

(63) Continuation of application No. 17/744,347, filed on May 13, 2022, now Pat. No. 11,782,807, which is a continuation of application No. 16/670,798, filed on Oct. 31, 2019, now Pat. No. 11,347,608, which is a continuation of application No. 15/907,210, filed on Feb. 27, 2018, now Pat. No. 10,481,973, which is a
(Continued)

(51) Int. Cl.
*G06F 11/20* (2006.01)
*G11C 11/4093* (2006.01)
*G11C 29/52* (2006.01)

(52) U.S. Cl.
CPC ...... *G06F 11/2094* (2013.01); *G11C 11/4093* (2013.01); *G11C 29/52* (2013.01); *G06F 2201/82* (2013.01)

(58) Field of Classification Search
None
See application file for complete search history.

(56) References Cited

U.S. PATENT DOCUMENTS 5,469,390 A 11/1995 Sasaki et al.
6,243,306 B1 6/2001 Kirihata
(Continued)

OTHER PUBLICATIONS

Ashok K. Sharma, "Memory Design for Testability and Fault Tolerance," in Semiconductor Memories: Technology, Testing, and Reliability, IEEE, 1997, pp. 195-248, doi: 10.1109/9780470546406. ch5. (Year: 2002).*
(Continued)

*Primary Examiner* — Daniel F. McMahon
(74) *Attorney, Agent, or Firm* — Lance Kreisman; Peninsula Patent Group

(57) ABSTRACT

A memory module is disclosed. The memory module includes a substrate, and respective first, second and third memory devices. The first memory device is of a first type disposed on the substrate and has addressable storage locations. The second memory device is also of the first type, and includes storage cells dedicated to store failure address information associated with defective storage locations in the first memory device. The third memory device is of the first type and includes storage cells dedicated to substitute as storage locations for the defective storage locations.

20 Claims, 9 Drawing Sheets

Related U.S. Application Data continuation of application No. 14/631,570, filed on Feb. 25, 2015, now Pat. No. 9,916,196.

(60) Provisional application No. 61/946,593, filed on Feb. 28, 2014.

(56) References Cited

U.S. PATENT DOCUMENTS

| | | | | |
|---|---|---|---|---|
| 6,574,757 | B1* | 6/2003 | Park | G11C 29/44 |
| | | | | 714/710 |
| 7,218,559 | B2 | 5/2007 | Satoh | |
| 8,867,286 | B2* | 10/2014 | Wu | G11C 29/76 |
| | | | | 365/189.08 |
| 2002/0196683 | A1* | 12/2002 | Ohtani | G11C 29/72 |
| | | | | 365/200 |
| 2004/0213058 | A1* | 10/2004 | Shimizu | G11C 29/4401 |
| | | | | 365/201 |
| 2007/0255982 | A1* | 11/2007 | Adsitt | G11C 29/56 |
| | | | | 714/718 |
| 2011/0047440 | A1* | 2/2011 | Blackmon | G06F 11/141 |
| | | | | 714/764 |
| 2011/0205796 | A1* | 8/2011 | Kim | H10B 43/27 |
| | | | | 365/185.17 |
| 2012/0204079 | A1 | 8/2012 | Takefman et al. | |
| 2013/0010538 | A1 | 1/2013 | Blodgett | |
| 2013/0058145 | A1 | 3/2013 | Yu et al. | |
| 2013/0121093 | A1* | 5/2013 | Morimoto | G06F 13/00 |
| | | | | 365/189.15 |
| 2014/0050039 | A1* | 2/2014 | Park | G11C 11/4091 |
| | | | | 365/230.03 |
| 2014/0321186 | A1* | 10/2014 | Ware | G11C 29/808 |
| | | | | 365/51 |
| 2014/0351629 | A1* | 11/2014 | Ware | G06F 11/1666 |
| | | | | 714/6.13 |

OTHER PUBLICATIONS

Karunaratne, Maddumage et al., "Optimizing BIST and Repair Logic for Embedded Memories", 2008 51st Midwest Symposium on Circuits and Systems, 2008 IEEE, pp. 350-353, doi: 10.1109/MWSCAS.2008.4616808. 4 pages.

\* cited by examiner

FIG. 8 [Write Timing]

MEMORY MODULE WITH DEDICATED REPAIR DEVICES

CROSS-REFERENCE TO RELATED APPLICATIONS

This application is a continuation of U.S. patent application Ser. No. 17/744,347, filed May 13, 2022, entitled MEMORY MODULE WITH DEDICATED REPAIR DEVICES, which is a continuation of U.S. patent application Ser. No. 16/670,798, filed Oct. 31, 2019, entitled MEMORY MODULE WITH DEDICATED REPAIR DEVICES, now U.S. Pat. No. 11,347,608, which is a continuation of U.S. patent application Ser. No. 15/907,210, filed Feb. 27, 2018, entitled MEMORY MODULE WITH DEDICATED REPAIR DEVICES, now U.S. Pat. No. 10,481,973, which is a continuation of U.S. patent application Ser. No. 14/631,570, filed Feb. 25, 2015, entitled MEMORY MODULE WITH DEDICATED REPAIR DEVICES, now U.S. Pat. No. 9,916,196, which is a Non-Provisional that claims priority to U.S. Provisional Application No. 61/946,593, filed Feb. 28, 2014, entitled MEMORY MODULE WITH DEDICATED REPAIR DEVICES, all of which is incorporated herein by reference in its entirety.

TECHNICAL FIELD

The disclosure herein relates to memory systems, and more specifically to on-module memory repair apparatus and methods.

BACKGROUND

Error codes are used in a variety of signaling systems to detect and, in some cases, correct errors relating to data transmission and storage. The codes generally provide redundancy to the original data so that, when the data is encoded via a particular error code algorithm, a limited number of data errors may be identified and possibly corrected upon decoding. The redundant portions of the encoded data may take the form of checksums, parity bits, or the like, depending on the type of error code employed.

For memory systems that employ error codes, the overhead often employed with the encoding generally limits the effectiveness of the code to a single-bit error in a given word. As a result, only a certain number of hard errors may be acceptable for a given memory component before the component fails as a reliable device.

Thus, the need exists for improved error detection and repair schemes that significantly improve the number of hard errors that may be corrected for a given memory component.

BRIEF DESCRIPTION OF THE DRAWINGS

Embodiments of the disclosure are illustrated by way of example, and not by way of limitation, in the figures of the accompanying drawings and in which like reference numerals refer to similar elements and in which.

DETAILED DESCRIPTION

Embodiments of memory systems, methods and integrated circuits are disclosed herein. One embodiment of a memory module described herein employs identical memory devices to provide both main memory and enhanced error detection/correction capability. One of the memory devices includes storage cells dedicated to store failure address information associated with defective storage locations in the main memory. Another of the memory devices includes storage cells dedicated to substitute as storage locations for the defective storage locations in the main memory. By incorporating dedicated memory devices to store fail address information and substitute data locations, the number of errors that can be repaired, due to faulty storage cells in the main memory, can be significantly increased over the number of errors correctable by standard EDC techniques alone. Further, since all of the memory devices on the module are the same, significant cost savings may be realized without requiring complex changes to the module memory devices or memory controller.

Figure 1:
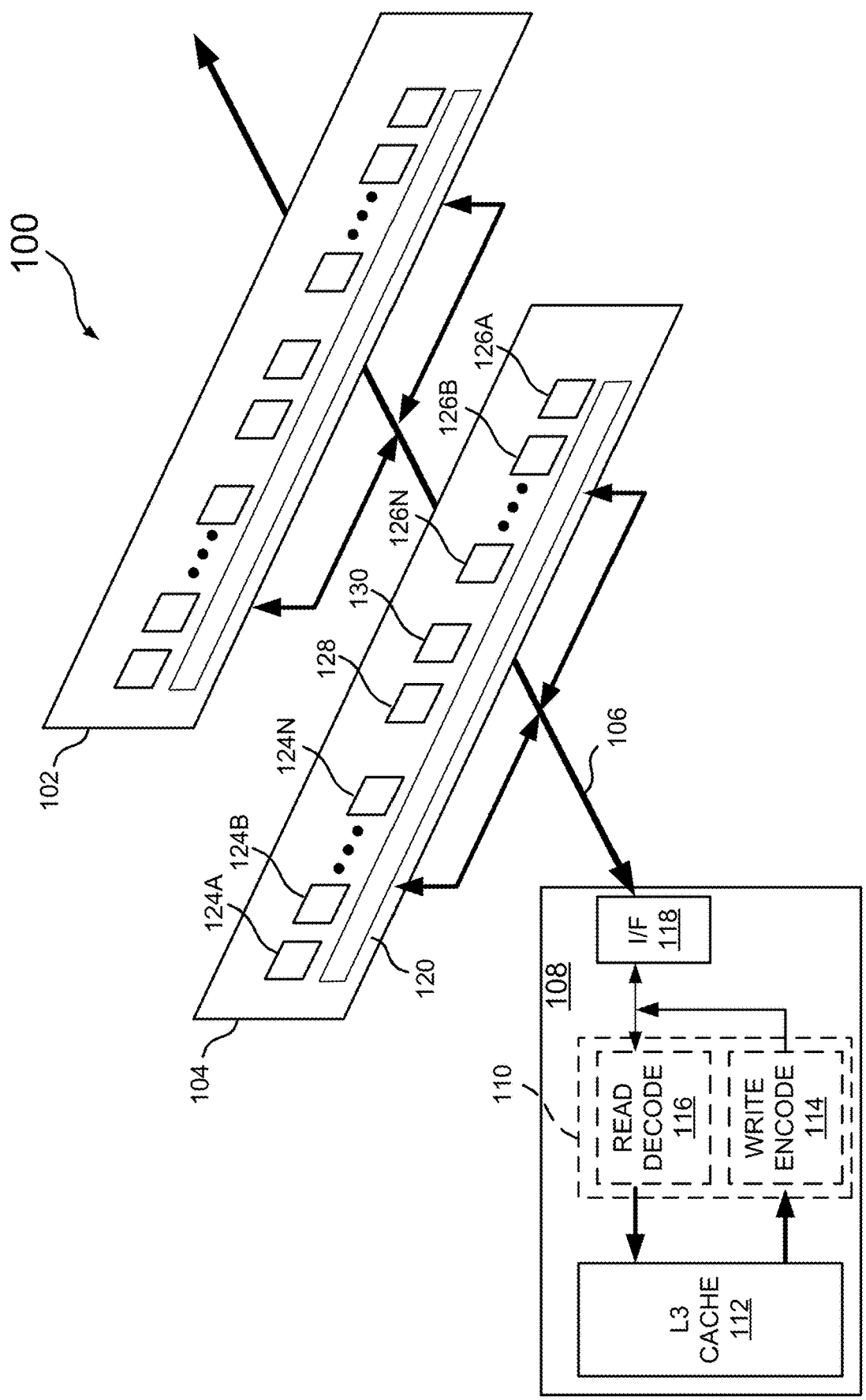
FIG. 1 illustrates one embodiment of a memory system that employs a memory controller and multiple memory modules.

Referring to FIG. 1, one embodiment of a memory architecture, generally designated 100, employs multiple memory modules 102 and 104 coupled to a primary bus 106 that transfers data, command and address signals. Memory control circuitry 108 in the form of a memory controller is also coupled to the primary bus 106 to direct data transfers between the modules 102 and 104 and the memory control circuitry 108. The memory control circuitry may include, e.g., a discrete memory controller separate from a requestor integrated circuit (IC), or any IC that controls a DRAM and could be any type of system-on-chip (SoC).

With continued reference to FIG. 1, one embodiment of the memory controller 108 optionally employs error detection/correction code (EDC) circuitry 110 that detects and corrects read data errors before passing the data to a Level 3 cache 112. The EDC circuitry 110 may include a write data EDC encoder 114 and a read data decoder 116. An interface 118 couples the memory controller 108 to the modules 102 and 104. EDC parity bits generated by the write data encoder 114 are passed along with the original data to the memory modules along the primary bus 106, and read back with the data for use in decoding read data in the read data decoder 116. The data encoding may be generated in accordance with one of many acceptable EDC algorithms including, for example, straightforward single-bit Hamming codes, to more sophisticated high-speed BCH (Bose, Ray-Chaudhuri and Hocquenghem) codes. Other EDC codes, such as Reed-Solomon codes, turbo codes, cyclic redundancy codes (CRC) and low density parity check (LDPC) codes may also be acceptable.

Further referring to FIG. 1, the embodiment shown illustrates a multi-drop bus, where the primary bus 106 is shared by the modules 102 and 104. Point-to-point topologies are also envisioned, but not illustrated. In one embodiment, the modules 102 and 104 are buffered, such that each module includes a buffer circuit 120 and groups of primary memory devices 124A-124N and 126A-126N. A fail address memory device 128 and a repair data memory device 130 are also provided on the module, and described in further detail below. The buffer circuit 120 isolates the various memory devices from the primary bus for each module. Thus, instead of the multiple memory devices for each module loading the primary bus, only the buffer circuit loads the bus. This minimizes capacitive loading on the shared primary bus, among other things.

As explained more fully below, the buffer circuit 120 may also employ EDC circuitry to identify and repair "hard" errors associated with one or more of the primary memory devices. For one embodiment, the error identification and repair is done in a manner wholly transparent to the memory controller 108, thus providing an additional layer of error correction capability that maximizes the EDC strength, or correction capability, of the coding carried out by the memory controller 108. In other embodiments, functions carried out by the buffer circuit may instead be carried out in the memory controller using appropriate EDC-related circuitry.

Figure 2:
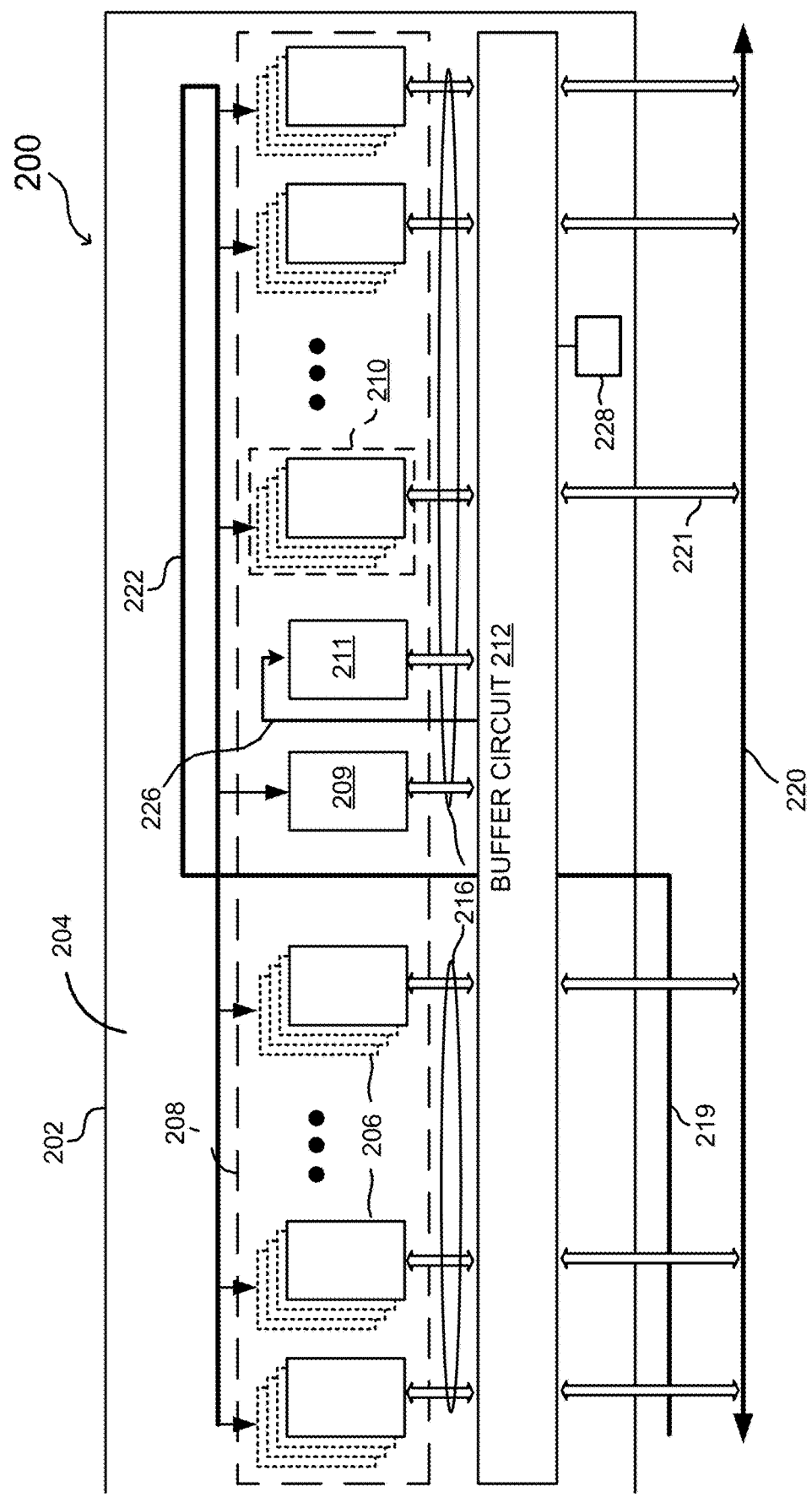
FIG. 2 illustrates one embodiment of a buffered memory module that may be used with the memory system of FIG. 1.

FIG. 2 illustrates additional detail for one embodiment of a memory module, generally designated 200, that corresponds to the buffered memory modules 102 and 104 of FIG. 1. Each module 200 includes a substrate 202 having a front face 204 that mounts a plurality of primary memory devices 206. The primary memory devices correspond to the primary memory devices 124A-124N, and 126A-126N of FIG. 1. For one embodiment, the primary memory devices are Dynamic Random Access Memory (DRAM) devices, of a given technology type and having certain operating characteristics (such as various generations of Double Data Rate (DDR) DRAM). The primary memory devices of all the modules generally collectively form a system's main memory. In some embodiments, the primary memory devices may be organized as "ranks". Typically, a rank corresponds to a set of separately addressable memory devices used for a single memory access. Thus, for the example shown in FIG. 2, the primary memory devices are organized into a single rank 208. Each primary memory device 206 may be realized as a single memory chip, or packaged to include plural memory die 210 in a stacked configuration (shown in phantom). In some embodiments, an additional set of memory devices (not shown) may be mounted on the back face of the module, and organized as an additional rank.

In addition to the primary memory devices 206, each module 200 mounts a fail address memory device 209 and a redundant data memory device 211. These devices correspond to the fail address and repair data memory devices 128 and 130 of FIG. 1. In one embodiment, the fail address and repair data memory devices 209 and 211 are structurally identical to the primary memory devices, and thus are of the same "type" of memory technology as the primary memory devices. Use of the same type of memory device for the primary, fail address, and redundant data memory devices significantly reduces costs since the use of low-volume and high-cost specialized/custom memory devices may be avoided.

Further referring to FIG. 2, for one embodiment, the rank 208 of primary memory devices 206 couples to a buffer circuit 212 via secondary data bus paths 216. The buffer circuit 212, in turn, interfaces with a memory controller (not shown) through a primary command/address (C/A) bus 219, and a primary data bus 220. The primary data bus is formed by a plurality of primary data transfer paths 221. For one embodiment, a secondary command bus 222 routes command signals from the buffer circuit 212 to all of the memory devices 206, 209 and 211 in a "fly-by" manner. A private command bus 226, couples the buffer circuit 212 to the fail address memory device 209. While the buffer circuit 212 is shown in FIG. 1 as a single device, it may take many different forms, including, for example, separate buffer chips for each memory device.

With continued reference to FIG. 2, one embodiment of the module 200 includes nonvolatile memory 228 to store error information associated with failed storage cells in one or more primary memory devices on the module. The errors may be determined during module manufacture, or during normal memory system operation. The stored information may be loaded to the fail address and redundant data memory devices 209 and 211 during periodic maintenance operations, or during system initialization.

Figure 3:
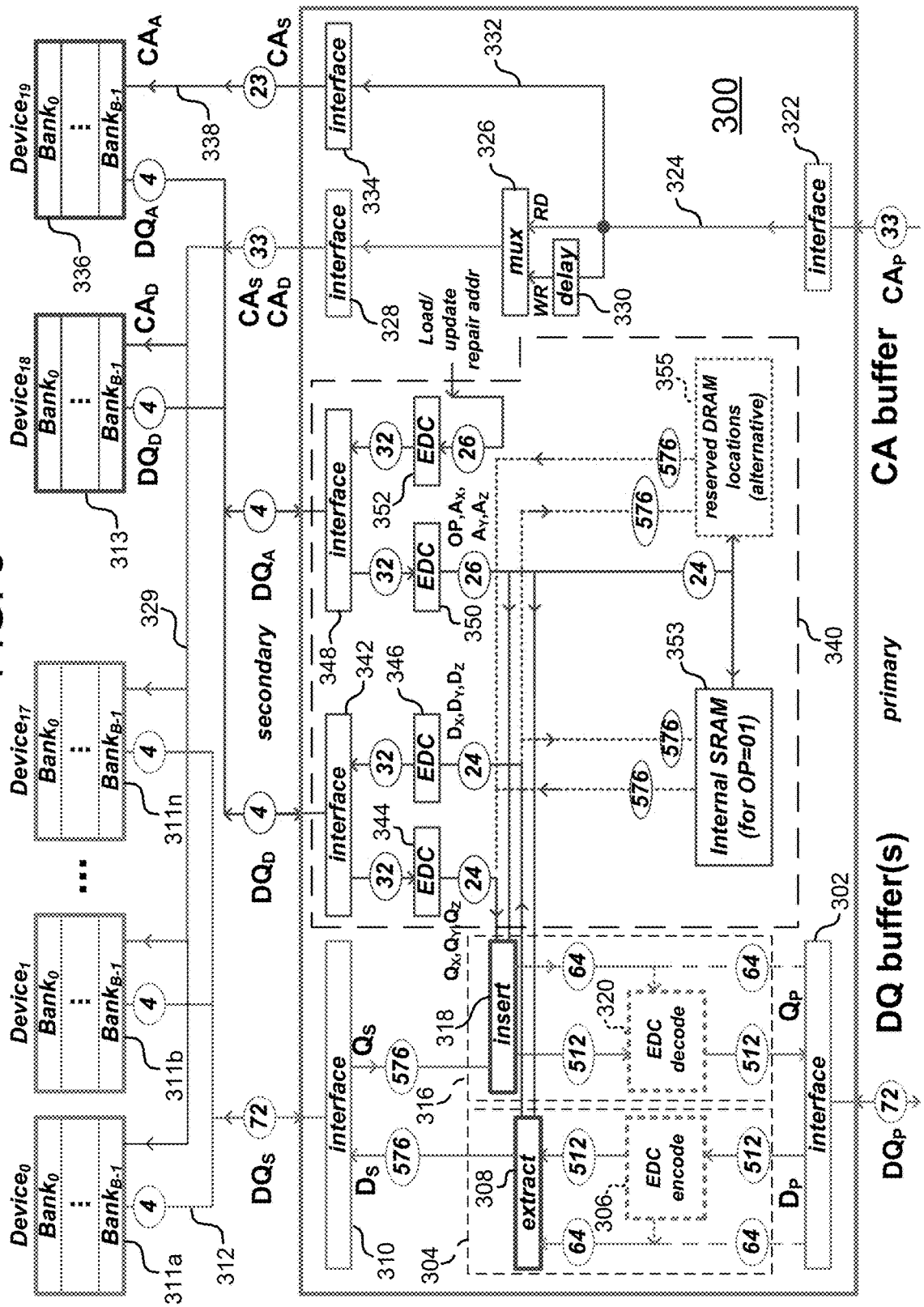
FIG. 3 illustrates an embodiment of a buffer circuit for use with the memory module of FIG. 2, and further detail associated with specific embodiments of respective data and control/address circuits employed in the buffer.

Referring now to FIG. 3, further details for a specific embodiment of a buffer circuit 300 corresponding to the buffer circuit 212 described in FIG. 2 are shown. As noted above, to enhance the error correction capabilities of the memory system, the memory module 200 includes a memory device 209 dedicated to store fail address information, and a repair data memory device 211 dedicated to providing substitute storage locations for addresses identified by the fail address information. To direct and control repairs to bits identified by the fail address memory 209, with the data stored by the redundant data memory 211, one embodiment of the buffer circuit 300 employs repair circuitry capable of performing byte repairs on a per column basis for all of the primary memory devices. While the description that follows is implementation-specific, it is to be understood that a variety of repair schemes may be employed to achieve the repair functions described herein.

In one specific embodiment, and with continued reference to FIG. 3, the buffer circuit 300 includes a primary data interface 302 that interacts with primary DQ data paths $DQ_p$ associated with the primary data bus 106 (FIG. 1). The primary data interface 302 generally acts to serialize 576-bit wide read and write transactions to and from a 72-bit wide interface. A write data path 304 directs deserialized write data from the primary data interface 302 to an optional EDC encoding circuit 306. If EDC encoding of the write data is performed by the memory controller 108 (FIG. 1), then the buffer EDC encoder 306 may not be employed. The EDC encoding of the 512 bit word generates 64 bits of parity information along with the original data. The data and parity information are fed to an extract circuit 308, which extracts data corresponding to known fail address locations, as more fully described below. One output of the extract circuit 308 feeds a secondary data interface 310 to serialize the output and deliver write data to a secondary data bus 312 formed by a plurality of secondary data paths $DQ_s$. In one specific embodiment, the secondary data transfer paths are each 4-bits wide, to correspond to 4-bit wide memory devices. Other widths may straightforwardly be employed, depending on the corresponding memory device widths and the application involved. The secondary data transfer paths $DQ_s$ route the write data to plural primary memory devices 311a-311n provided on the module.

Further referring to FIG. 3, the primary data interface 302 within the buffer 300 also includes a read data path 316 that directs deserialized read data and parity information from the secondary data interface 310 to an insert circuit 318. The insert circuit 318 inserts repair data corresponding to known fail address locations, as more fully described below. One output of the insert circuit 318 feeds the read data and parity information to an optional EDC decoder 320. The EDC decoder 320 processes the data and parity to generate a syndrome that may detect and correct one or more errors. For some embodiments, the EDC decoding may take place at the memory controller 108 (FIG. 1). The decoded read data is then directed to the primary data interface 302, where it is serialized and transferred to the memory controller 108.

With continued reference to FIG. 3, the buffer 300 also includes a primary control/address (C/A) interface 322 that receives command, control and address information from the memory controller 108. The C/A information is routed along a C/A path 324 to a multiplexer 326. For read operations, the C/A information is fed directly to an input of the multiplexer, and output to a secondary C/A interface 328. The C/A information is then directed from the secondary C/A interface 328 along bus 329 to the C/A inputs of the primary and repair data memory devices 311a-311n and 313. For write operations, the C/A information is fed through a programmable delay circuit 330 before being routed to a second input of the multiplexer 326. A dedicated repair C/A path 332 is provided to route a truncated version of the C/A information for each read/write operation to a secondary repair C/A interface 334. The secondary repair C/A interface 334 then exclusively feeds the truncated C/A information to a fail address memory device 336 via a secondary repair C/A path 338.

To carry out repairs, the buffer 300 employs repair logic 340 that controls the respective insert and extract circuits 318 and 308 referred to above. The repair logic 340 includes a repair data interface 342 to serialize/deserialize transferred repair data tags between the repair data memory device 313 and the buffer 300. For read operations, data tags (described more fully below) are deserialized by the repair data interface 342 and fed to a read repair EDC decoder 344. The read repair EDC decoder 344 evaluates the parity information and data associated with the data tag, and passes up to three bytes of repair data from the data tag to the insert circuit 318. The repair data is then inserted into appropriate bit positions in the 512-bit read data word fed into the insert circuit 318 from the secondary data interface 310. For write operations, data bytes extracted by the extract circuit 308 are fed to a write repair EDC encoder 346, with a resulting write data tag including up to three data bytes and associated parity information. The encoded information is then passed to the repair data interface 342, where it is serialized and fed to the repair data memory device 313.

The repair logic 340 further includes a fail address interface 348 to serialize/deserialize transferred repair address tags (explained more fully below) between the fail address memory device 336 and the buffer 300. For read operations, address tags are deserialized by the fail address interface 348, and fed to a fail address EDC decoder 350. The fail address EDC decoder 350 evaluates the decoded parity information and feeds opcode information and up to three addresses of fail locations within the addressed column to the insert circuit 318. The repair data from the repair data memory device 313 is inserted by the insert circuit 318 into the locations identified by the addresses provided by the fail address memory device 336. For write operations, the deserialized and decoded address tags are fed to the extract circuit 308 to identify the bit positions for data that should be extracted and written to the repair data memory device 313.

For one embodiment, the repair logic 340 utilizes a SECDED error detection/correction code having a (32, 26) format capable of correcting a single random error, or detecting two errors in a 26-bit word. A total of 32 bits are generated from a coding of a 26-bit data word, with the result being the original 26-bit data interspersed with 6 parity bits that, when decoded, generate an error syndrome. Similar Hamming-type coding schemes may be extended to 512 bit data chunks (576, 512), or higher. In general, decoding the syndrome following receipt of a data word allows for the detection of an error, and provides a pointer to the location of the error in the word.

As new error address locations are identified, such as through various maintenance operations, or upon system initialization, new fail address information may be loaded into a repair EDC encoder 352, routed through the fail address interface 348, serialized, and passed along to the fail address memory device 336 as a new repair address tag.

Further referring to FIG. 3, the repair logic 340 includes internal SRAM 353 capable of storing one or more columns of 576 bits (data and parity). The SRAM may be selected based on an OPCODE specified in a repair address tag, more fully described below. Alternatively, a portion of main memory DRAM (such as from a portion of the storage capacity provided by primary memory devices 311a-311n) may be reserved, represented by block 355, to provide substitute storage locations for data originally directed to fail addresses.

The memory architecture above lends itself well to carrying out repairs at the manufacturing stage, such as when a memory module undergoes final assembly and test, or during normal operation as a main memory system for computing resources. Failures identified during manufacture, such as in final module assembly and test, may be repaired, and the repair information stored in the nonvolatile memory 228 (FIG. 2), until retrieved upon usage in a memory system operating environment. In some embodiments, the buffer circuitry may include test circuitry to allow the dedicated fail address and repair data memory devices to be tested during module test operations.

Figure 4:
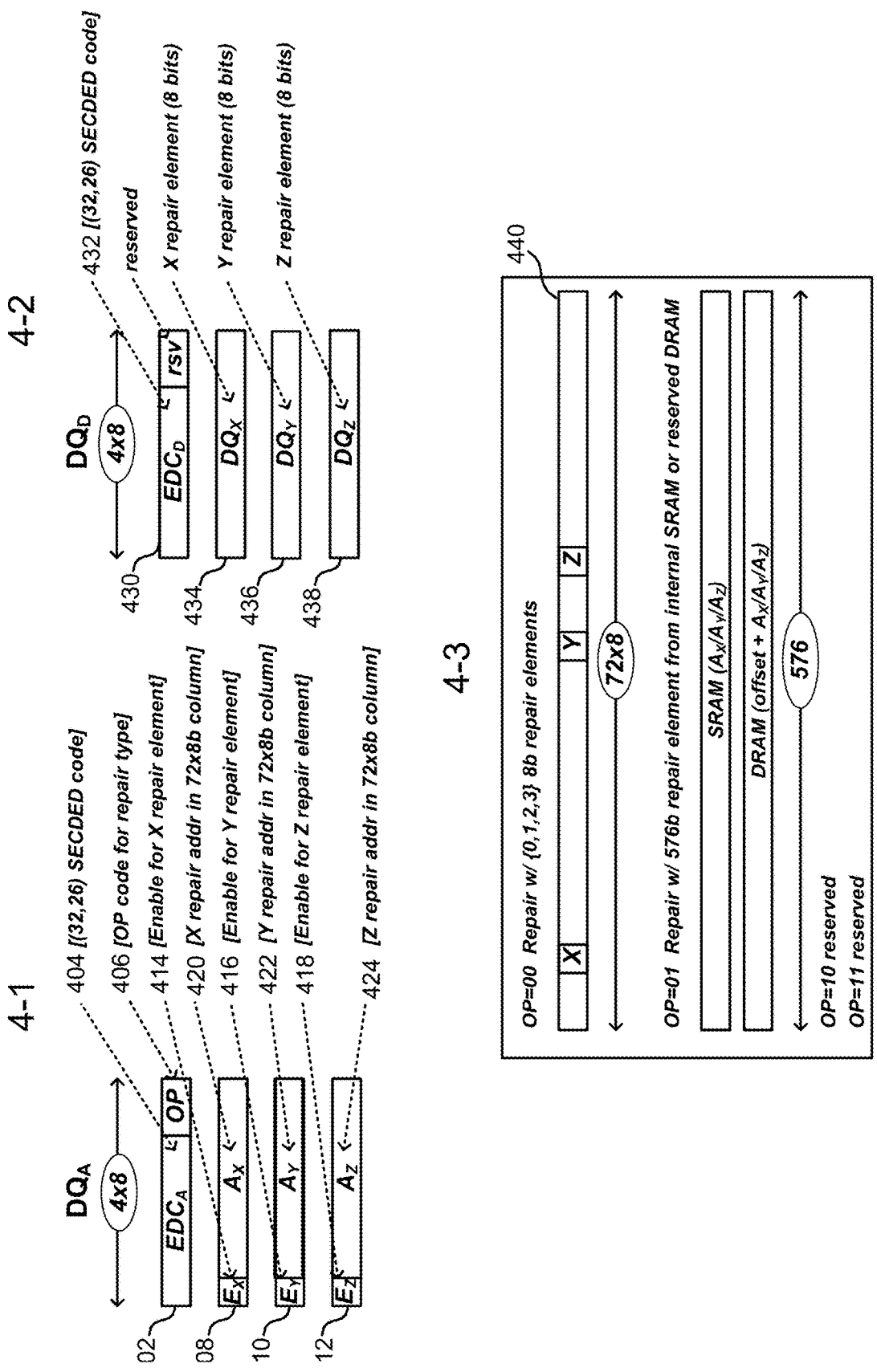
FIG. 4 illustrates examples of repair tag data structures.

FIG. 4 illustrates embodiments of repair tag data structures used by the repair logic 340 to transfer the fail address information and data between the fail address and repair data memory devices 313 and 336 and the insert and extract circuits 318 and 308. One embodiment of a data structure for a fail address tag is shown in detailed portion labeled 4-1. The fail address tag includes four 8-bit fully associative entries, totaling 32 bits. A first entry of the data tag, at 402, may include a SECDED error code field 404 that contains EDC encoded information associated with the tag, and an OPCODE field, at 406. The OPCODE field identifies a repair type, more fully explained below. Each of the three remaining entries, at 408, 410, and 412, include respective enable fields 414, 416, and 418 that indicate whether an error exists. Each enable field is associated with an address field, at 420, 422, and 424 that points to an error location in a given addressed column. The specific embodiment described above provides entries to correct up to three errors in the given column.

For one embodiment, and with continued reference to FIG. 4, data corresponding to the exemplary address tag described above may be packaged into a data tag. One specific embodiment of a data tag is shown in detailed portion labeled 4-2, illustrating four 8-bit fully associative entries, thus totaling 32 bits. Like the fail address tag, a first data tag entry, at 430, includes an EDC field 432 for EDC encoded data. The remaining three entries, at 434, 436, and 438, are associated with data bytes used to substitute for the byte locations identified in the corresponding fail address tag.

FIG. 4 also shows embodiments of column data structures corresponding to different OPCODE repair types. For one embodiment, an OPCODE of "00", specified in the OPCODE field 406 for one address tag, may specify that up to three random byte repairs may be made on a per-column basis. Detailed portion 4-3 of FIG. 4 illustrates respective X, Y, and Z error locations within a given 512-bit column word, at 440. For an OPCODE of "01", as an example, a $4^{th}$ repair may be made where an entire 576-bit column of data may be repaired through substitution of available SRAM storage, such as at 353 (FIG. 3), or other reserved DRAM storage, such as at 355 (FIG. 3), as examples. Other OPCODE possibilities may be provided depending on the application and number of available OPCODE bits.

Figure 5:
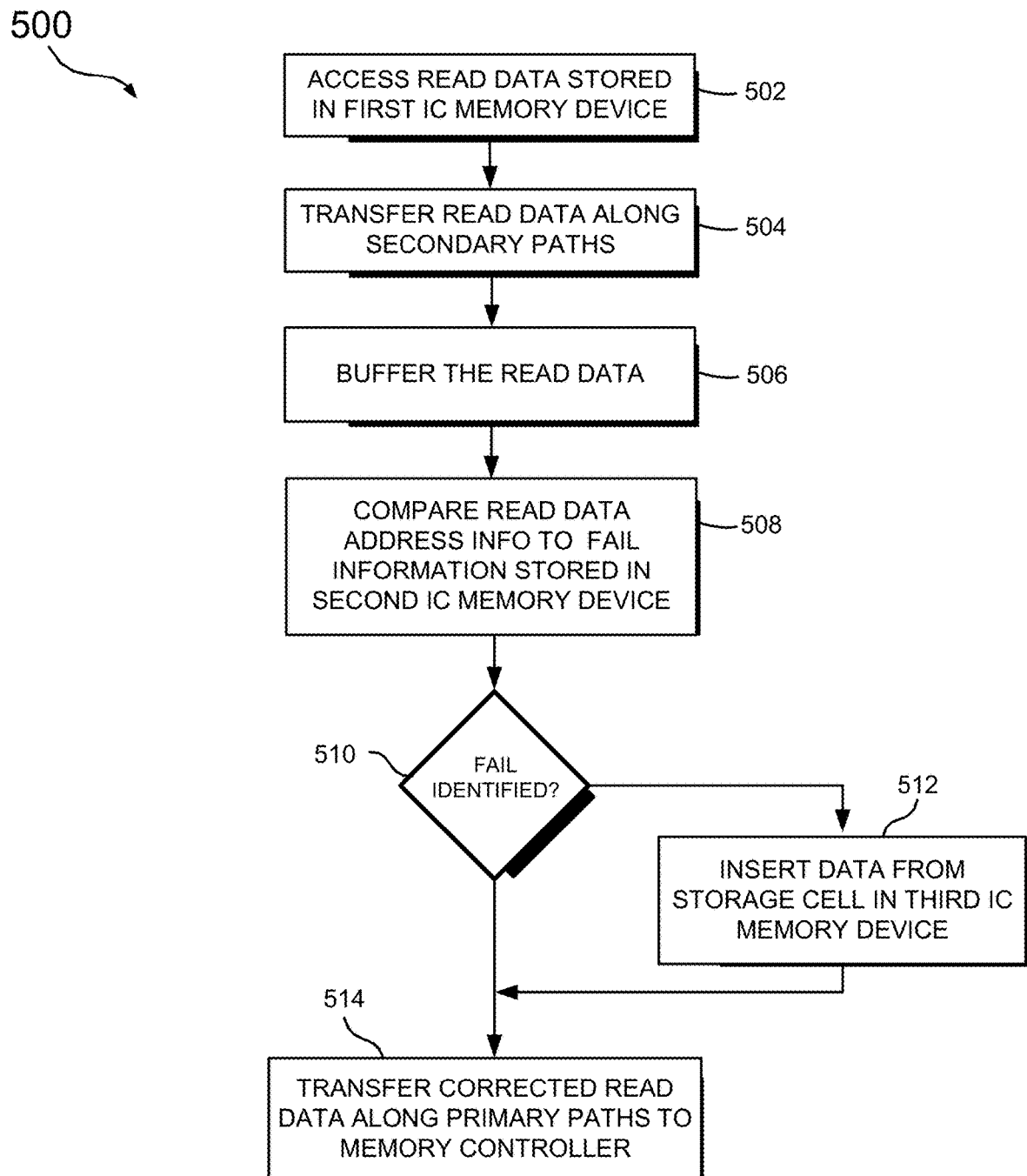
FIG. 5 illustrates a flowchart of steps for read operations carried out by the buffered memory module of FIG. 2.

FIG. 5 shows a flowchart of steps that may be performed in accordance with one embodiment of a repair method described herein, generally designated 500, during normal write operations using the circuitry described above and shown in FIGS. 1-4. The method seeks to take advantage of memory systems that employ error correction coding schemes, but with little impact to the designs of the memory controller or memory devices. For some embodiments, an initialization procedure will have been carried out as the system is powered on. The initialization generally involves loading any previously stored error information, such as identified during manufacture or previous normal operations, from the nonvolatile storage into the fail address memory device. With the tag information stored in the fail address memory device, normal repair operations may commence.

Further referring to FIG. 5, in response to a series of read commands from the memory controller to retrieve a specified column of data from the primary memory devices, the specified data (in this example, a 512 bit column with an additional 64 parity bits) is accessed, at 502, and transferred from the memory devices along secondary data paths, at 504, to the buffer, where the read data is buffered, at 506. Address information associated with the buffered read data is then compared to addresses of known failures that are stored in the fail address memory device, at 508. If the comparison results in a match, at 510, then a data bit from a remapped storage cell in the repair data memory device is inserted (via the insert circuit) into the bit location of the read data word that includes the known error, at 512. The repaired data word is then transferred to the memory controller over the primary data paths, at 514. Note that the correction to the data by the repair logic is not being carried out by a decoding of the associated EDC, but rather through a substitution of data from a corresponding number of repair cells in the repair data memory device. The repair cells are mapped to store bit values originally intended for defective cells in the primary memory devices. Thus, the EDC that is typically applied to read data between the buffer and the memory controller is unaffected by the known (and corrected) error. If no fail is identified, the originally-accessed read data word is transferred, at 514.

Figure 6:
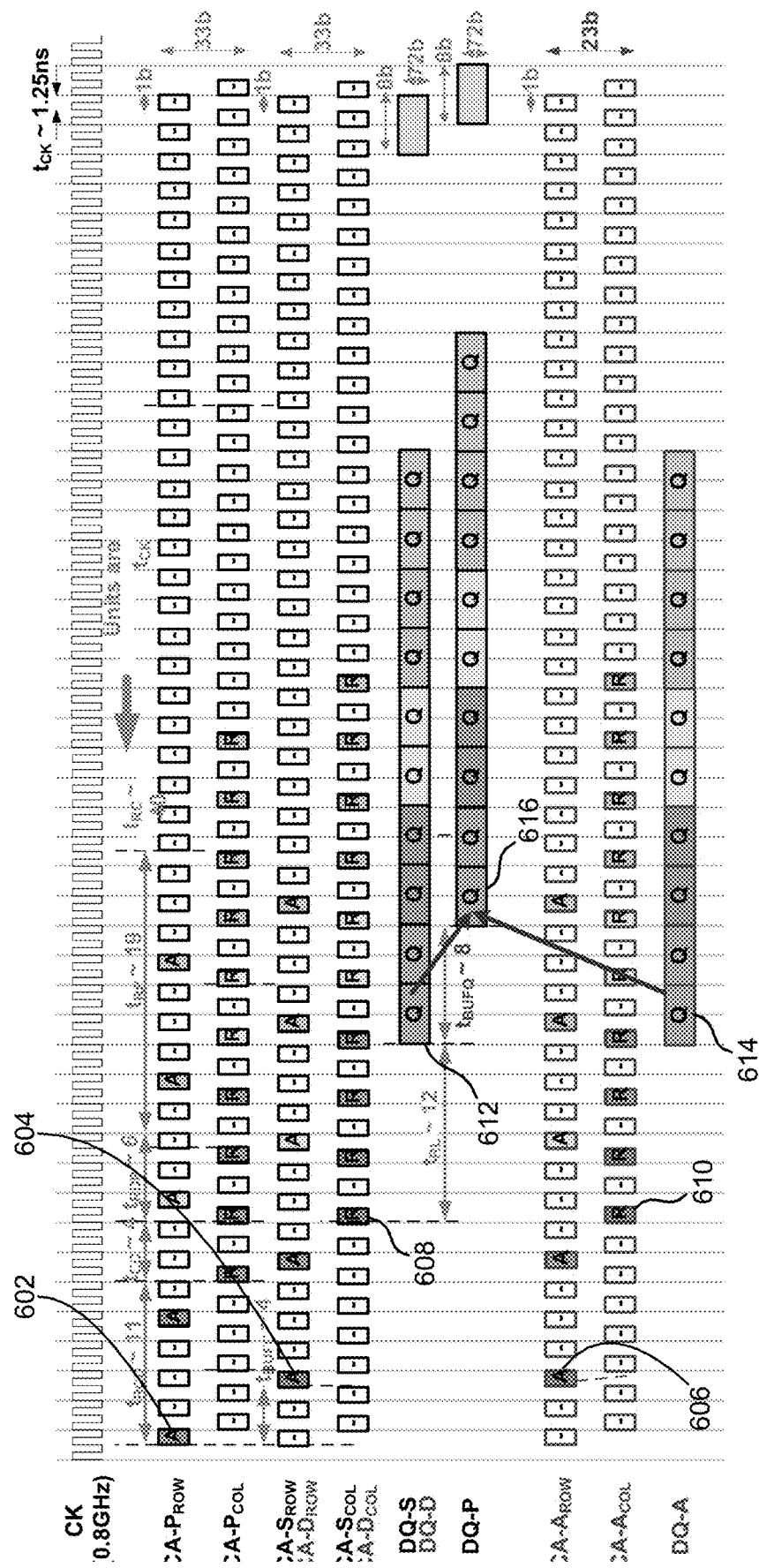
FIG. 6 illustrates one example of the timing carried out for pipelined read operations consistent with the method steps of FIG. 5.

FIG. 6 illustrates a timing chart associated with pipelined read operations consistent with the method steps described above with respect to FIG. 5. Multiple banks operating in a round robin fashion are shown, with the description below focusing on the operations highlighted in light grey shading, associated with a first bank. The waveform CK represents a timing reference for the read operations, where every four intervals of the clock corresponds to a column cycle time tCC. A tCC is a timing parameter that represents the minimum time necessary to carry out a column access. At 602, a row activate command ACT is received by the buffer via the primary C/A path. Following a buffer delay, the activate command appears on the secondary C/A path, at 604. In parallel with the secondary C/A path, the activate command is dispatched along the repair C/A path to the fail address memory, at 606. Subsequent to the activate command, respective column read commands are received on the secondary C/A bus and the repair C/A bus, at 608 and 610. In response to the column read commands, data is retrieved from an addressed column in a primary memory device, and from the dedicated repair data memory device, at 612. Fail address information read from the fail address memory is then sent to the insert circuit along with any corresponding data from the repair data memory, at 614. If a fail address enable bit in a fail address tag indicates one or more data bit substitutions are required, one or more bits are inserted from a corresponding repair data tag into the appropriate bit locations in the data, at 616. The corrected data is then EDC decoded (not shown in the chart) to determine if any further errors are associated with the data. Following EDC decoding, the data is then passed to the primary data interface for transfer to the memory controller. Note that for read operations, the timing characteristics associated with the primary memory devices and the fail address and repair data devices are the same.

Figure 7:
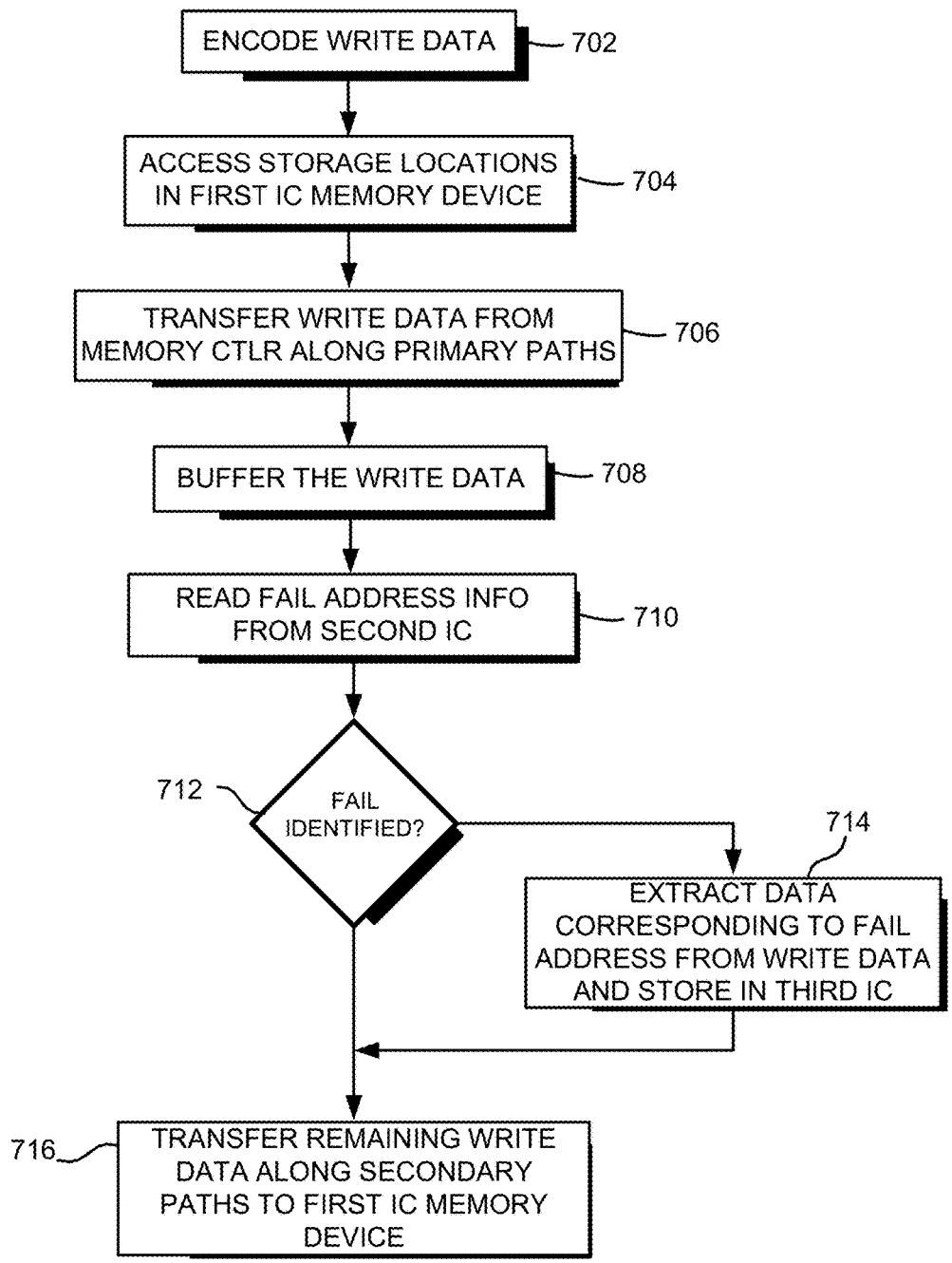
FIG. 7 illustrates a flowchart of steps for write operations carried out by the buffered memory module of FIG. 2.

Referring to FIG. 7, for a write operation that involves a given column of data (although many columns are usually involved in a given write operation), the data is first received by the memory interface and error encoded to generate EDC parity information, at 702. In response to a series of commands from the memory controller to write the specified column of data (in this example, a 512-bit column of data with an additional 64 parity bits generated by the EDC code) to a memory device, the storage locations for a corresponding row or page in an addressed bank are accessed, at 704.

Further referring to FIG. 7, with the column access in process, the write data is transferred from the memory controller to the memory module along the primary data bus, at 706. The data is then buffered, at 708, and the fail address memory device read, at 710, for addresses corresponding to the accessed column. The fail address tag retrieved in response to the read operation is provided to the extract circuit. If an enabled fail address is identified from the fail address tag, at 712, the retrieved fail address information is fed to the extract circuit, which responds to the address information by extracting data bits corresponding to identified failure locations, at 714. The extracted bits are then stored in the repair data memory device. The addressed column may then be accessed, and the write data written into the accessed primary memory device, at 716.

Note that for write operations, the reading of the fail address memory device alters the timing characteristics of the fail address and repair data memory devices with respect to the primary memory devices. Over multiple cycles, the altered timing may manifest itself as an increase in write-read turnaround time, which may be straightforwardly compensated for by the memory controller.

Figure 8:
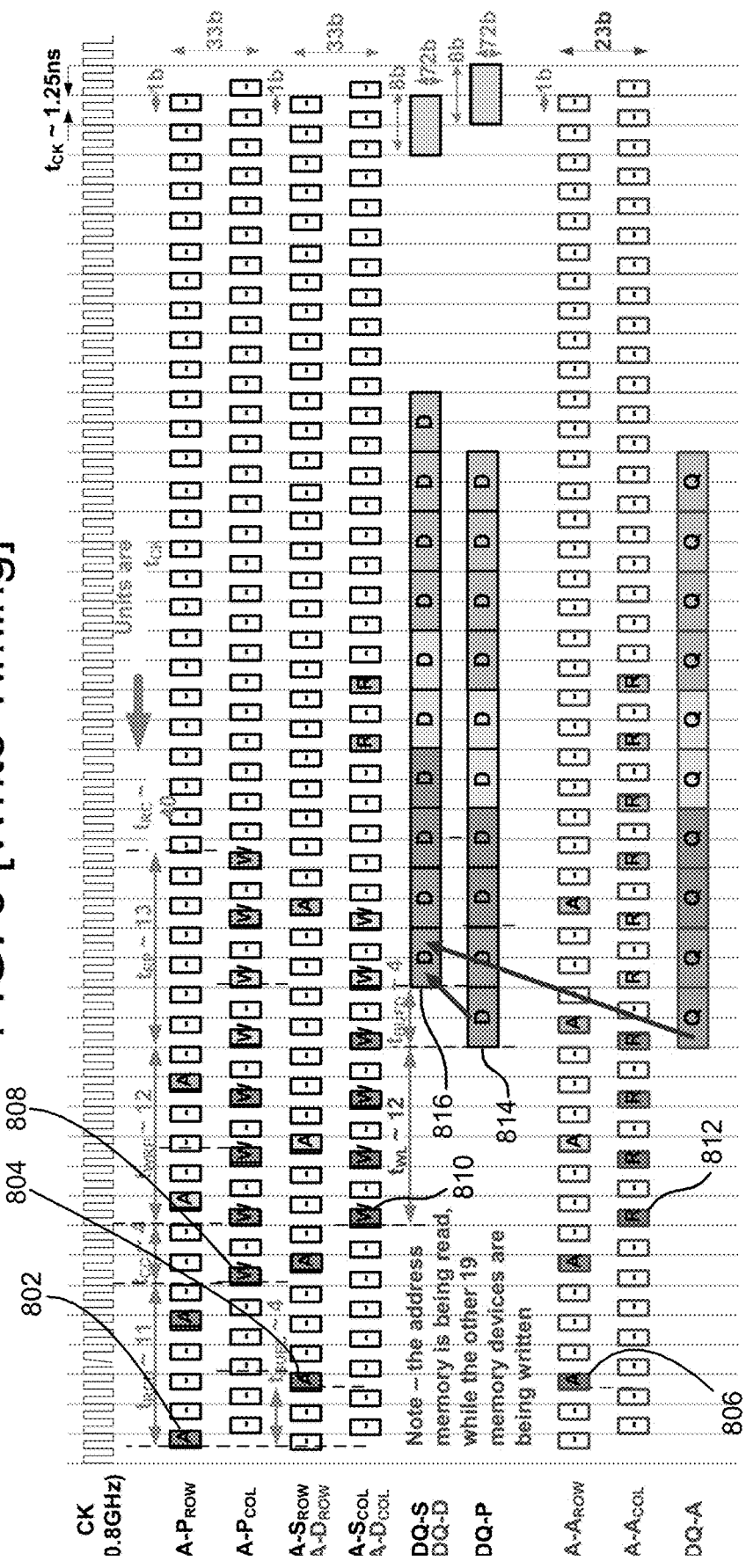
FIG. 8 illustrates one example of the timing carried out for pipelined write operations consistent with the method steps of FIG. 7.

FIG. 8 illustrates a timing chart associated with pipelined write operations consistent with the method described above for FIG. 7. Like FIG. 6, the waveform CK represents a timing reference for the write operations, where every four intervals of the clock corresponds to a column cycle time tCC.

Further referring to FIG. 8, at 802, a row activate command ACT is transferred along the primary C/A bus. At 804, following the buffer delay, the activate command propagates along the secondary C/A path. A corresponding activate command is passed along the repair C/A path to the fail address memory, at 806. A write command is then forwarded along the primary C/A bus, at 808, and after the buffer delay, propagates along the secondary C/A bus, at 810. As the write command is dispatched to the primary memory devices, and the repair data memory device, a read command is sent to the fail address memory device, at 812. Write data is then delivered to the buffer along the primary data bus, at 814. Read data from the fail address memory device is fed to the extract circuit, and data bits corresponding to the fail address information is extracted from the write data, at 816. The write data is then transferred to the accessed primary memory devices, and the extracted data bits directed to the repair data memory device.

Figure 9:
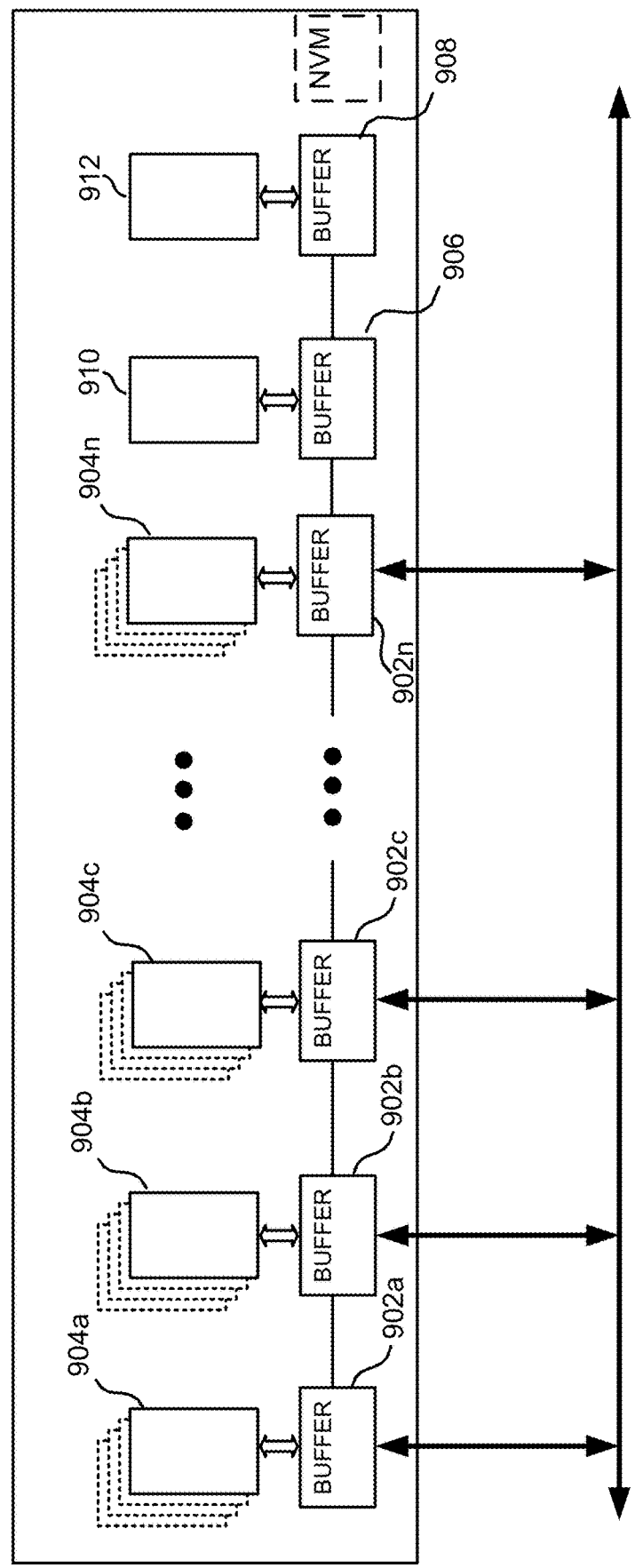
FIG. 9 illustrates an alternative buffered memory module similar to the module of FIG. 2.

FIG. 9 illustrates one embodiment of a buffered memory module, generally designated 900. Instead of providing a single buffer circuit or chip, the module employs a plurality of micro-buffer circuits 902a-902n for interfacing with primary memory devices 904a-904n. Two additional micro-buffer circuits 906 and 908 are provided to interface with dedicated repair data and fail address memory devices 910 and 912, respectively. Each micro-buffer circuit includes sufficient logic resources to carry out the buffer functions described above, on a per memory device basis. In one embodiment, each micro-buffer circuit is packaged with one or more memory devices.

Embodiments of memory systems, methods and integrated circuits are disclosed herein. One embodiment of a memory module is disclosed. The memory module includes a substrate, and respective first, second and third memory devices. The first memory device is of a first type disposed on the substrate and has addressable storage locations. The second memory device is also of the first type, and includes storage cells dedicated to store failure address information associated with defective storage locations in the first memory device. The third memory device is of the first type and includes storage cells dedicated to substitute as storage locations for the defective storage locations.

In a further embodiment, a method of operation in a memory module is disclosed. The method includes accessing data storage locations in a first memory device of a first type in response to a request from a memory controller. Failure address information is retrieved from a second memory device of the first type. The second memory device is dedicated to storing the failure address information. A determination is made as to whether the accessed data storage locations correspond to the failure address information retrieved from the second memory device. Data storage locations are accessed in a third memory device of the first type in response to the determined failure address locations in the first memory device. The third memory device is dedicated to providing substitute storage locations for the determined failure locations of the first memory device.

In yet another embodiment, an integrated circuit (IC) device is disclosed. The IC device includes respective primary and secondary data interfaces for transferring data between a memory controller and a first memory device of a first type. Respective primary and secondary command/address (C/A) interfaces are provided for transferring control/address information from the memory controller to the first memory device. The IC device includes repair logic having a repair data interface for coupling to a second memory device of the first type. The second memory device is dedicated to storing failure address information associated with the first memory device. A repair C/A interface is provided for coupling to a third memory device of the first type. The third memory device is dedicated to storing data associated with the failure address information.

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. A memory device, comprising:
    an array of storage locations dedicated to store failure address information associated with defective storage locations in a second memory device, the failure address information accessible during a first access operation that at least partially overlaps a second access operation directed to the defective storage locations of the second memory device; and
    interface circuitry coupled to a memory repair circuit to receive a command for executing the first access operation.

2. The memory device according to claim 1, wherein:
    the second access operation comprises a read operation or a write operation carried out during a first access time interval; and
    wherein the first access operation comprises a read operation or a write operation carried out during a second access time interval that temporally overlaps at least a portion of the first access time interval.

3. The memory device according to claim 1, wherein:
    the command for executing the first access operation comprises a read command; and
    wherein the interface circuitry transmits at least a portion of the failure address information as read data to the memory repair circuit in response to the read command.

4. The memory device according to claim 1, wherein:
    the command for executing the first access operation comprises a write command; and
    wherein the interface circuitry receives updated failure address information as write data from the memory repair circuit in response to the write command.

5. The memory device according to claim 1, realized as a dynamic random access memory (DRAM) device.

6. The memory device according to claim 1, wherein the failure address information is encoded via an error code.

7. The memory device according to claim 6, wherein the error code comprises an error detection code (EDC).

8. A method of operation in a memory device, the method comprising:
    receiving a command for executing a first access operation; and
    accessing, in response to the command, storage locations dedicated to store failure address information associated with defective storage locations in a second memory device, the accessing at least partially overlapping a second access operation directed to the defective storage locations of the second memory device.

9. The method of claim 8, wherein:
    the second access operation comprises a read operation or a write operation carried out during a first access time interval; and
    wherein the accessing comprises performing a read operation or a write operation during a second access time interval that temporally overlaps at least a portion of the first access time interval.

10. The method of claim 8, wherein:
    the command for executing the first access operation comprises a read command; and
    wherein the accessing further comprises transmitting at least a portion of the failure address information as read data to a memory repair circuit in response to the read command.

11. The method of claim 8 wherein:
    the command for executing the first access operation comprises a write command; and
    wherein the accessing further comprises receiving updated failure address information as write data from a memory repair circuit in response to the write command.

12. The method of claim 8, wherein:
    the command for executing the first access operation is compliant with a dynamic random access memory (DRAM) protocol.

13. The method of claim 8, wherein:
    applying an error code to the data and the failure address information stored in the memory device and the second memory device.

14. The memory device according to claim 8, wherein the failure address information is encoded via an error code.

15. The memory device according to claim 14, wherein the error code comprises an error detection code (EDC).

16. An integrated circuit (IC) dynamic random access memory (DRAM) chip, comprising:
    an array of storage locations dedicated to store failure address information associated with defective storage locations in a second IC DRAM chip, the failure address information accessible during a first access operation that at least partially overlaps a second access operation directed to the defective storage locations of the second IC DRAM chip; and
    interface circuitry coupled to a memory repair circuit to receive a command for executing the first access operation.

17. The IC DRAM chip of claim 16, wherein:
    the second access operation comprises a read operation or a write operation carried out during a first access time interval; and
    wherein the first access operation comprises a read operation or a write operation carried out during a second access time interval that temporally overlaps at least a portion of the first access time interval.

18. The IC DRAM chip of claim 16, wherein:
    the command for executing the first access operation comprises a read command; and
    wherein the interface circuitry transmits at least a portion of the failure address information as read data to the memory repair circuit in response to the read command.

19. The IC DRAM chip of claim 16, wherein:
the command for executing the first access operation comprises a write command; and
wherein the interface circuitry receives updated failure address information as write data from the memory repair circuit in response to the write command.

20. The IC DRAM chip of claim 16, wherein the failure address information is encoded via an error code.

* * * * *